(12) United States Patent
Kharrazi-Olsson et al.

(10) Patent No.: US 7,492,091 B2
(45) Date of Patent: Feb. 17, 2009

(54) DIFFUSION BARRIER LAYER AND METHOD FOR MANUFACTURING A DIFFUSION BARRIER LAYER

(75) Inventors: Maryam Kharrazi-Olsson, Buchs SG (CH); Hai Tran Quoc, Orsay (FR); Alice Gallissian, Cachan (FR)

(73) Assignee: OC Oerlikon Balzers AG, Balzers (LI)

( * ) Notice: Subject to any disclaimer, the term of this patent is extended or adjusted under 35 U.S.C. 154(b) by 455 days.

(21) Appl. No.: 11/061,143

(22) Filed: Feb. 18, 2005

(65) Prior Publication Data

US 2005/0194898 A1 Sep. 8, 2005

Related U.S. Application Data

(60) Provisional application No. 60/546,274, filed on Feb. 20, 2004.

(51) Int. Cl.
H05B 33/00 (2006.01)

(52) U.S. Cl. .............. 313/504; 313/506; 313/512; 428/917; 428/472; 428/472.2; 428/689; 428/693.1

(58) Field of Classification Search .............. None
See application file for complete search history.

(56) References Cited

U.S. PATENT DOCUMENTS

| 6,268,695 | B1 | 7/2001 | Affinito |
| 6,458,512 | B1 * | 10/2002 | Budd et al. ............ 430/311 |
| 6,522,067 | B1 * | 2/2003 | Graff et al. ............ 313/512 |
| 6,573,652 | B1 | 6/2003 | Graff et al. |
| 6,576,351 | B2 | 6/2003 | Silvernail |
| 6,597,111 | B2 | 7/2003 | Silvernail et al. |
| 6,638,645 | B2 | 10/2003 | Sawai et al. |
| 2003/0104753 | A1 | 6/2003 | Graff et al. |
| 2003/0127651 | A1 | 7/2003 | Murakami et al. |
| 2003/0129298 | A1 | 7/2003 | Tera et al. |
| 2003/0183830 | A1 | 10/2003 | Yamazaki et al. |
| 2003/0193286 | A1 | 10/2003 | Ottermann et al. |

FOREIGN PATENT DOCUMENTS

WO 03/050894 6/2003

OTHER PUBLICATIONS

H. Lifka et al. "Thin Film Encapsulation of OLED Displays with a NONON Stack." SID 04 Digest, ISSN/0004-0966X/04/3502-1384, p. 50.3.
Ayako Yoshida et al. "Invited Paper: 3-Inch Full-color OLED Display using a Plastic Substrate." SID 03 Digest, ISSN/0003-0966X03/3402-0856, p. 21.1.

* cited by examiner

Primary Examiner—Ashok Patel
(74) Attorney, Agent, or Firm—Pearne & Gordon LLP

(57) ABSTRACT

A diffusion barrier system for a display device comprising a layer system with at least two layers of dielectric material, wherein at least two adjacent layers of that layer system comprise the same material. A respective method for manufacturing such a diffusion barrier system in a single process chamber of a plasma deposition system has the steps of introducing a substrate to be treated in said process chamber, discretely varying in a controlled manner during deposition at least one process parameter in the process chamber, without completely interrupting such process parameter, which results in layers with different properties and finally unloading said substrate from said process.

6 Claims, 3 Drawing Sheets

DIFFUSION BARRIER LAYER AND METHOD FOR MANUFACTURING A DIFFUSION BARRIER LAYER

FIELD OF THE INVENTION

A (solid state) ultra high diffusion barrier and encapsulation layer for optoelectronic devices, consisting of multiple inorganic layers, which are deposited by a single step vacuum deposition process.

BACKGROUND OF THE INVENTION

The present invention relates generally to optoelectronic devices and more specifically to environmentally sensitive optoelectronic devices. These devices include organic optoelectronic devices such as organic light emitting diodes (OLED) be it either small molecules or polymer type, organic photovoltaic devices, organic thin film transistors, and organic electrochromic displays, electrophoretic inks, solar devices, and LCD's in general (including applications for watches, cell phones etc.).

Many such optoelectronic devices are known in the art. However, specifically organic optoelectronic devices such as OLEDs have not yet made their predicted significant economic and technical breakthrough. This is partially due to the fact that the organic structures and the cathodes need to be heavily protected from the environment, specifically from oxygen, from water and from water vapor.

Currently, many optoelectronic devices (such as LCD and OLED displays) are manufactured by depositing thin film structures on a glass substrate, which has excellent optical properties and which is also an excellent environmental barrier. Most organic optoelectronic devices today are also manufactured on glass substrates and are encapsulated in glass (or in metallic-) structures. By its brittle nature however, glass does not provide flexibility and light weight. By using thin, flexible polymeric substrates for OLEDs in particular—which is known in the art—and by thin encapsulation layers for the device, a high degree of flexibility and lightweight shall be obtained. However, the following problems arise simultaneously:

Thin polymeric substrates and organic structures have a diffusion coefficient for oxygen and for water, which is far too high to protect the enclosed structures from degradation.

Thin polymeric substrates and organic structures are susceptible to degradation, deformation and building up of thermally induced stresses when the functional layers are deposited due to the process temperature created intentionally or unintentionally during the deposition.

For illustration, FIG. 1 shows the typical build up for an organic optoelectronic device on an organic substrate: in order to protect the device (here an OLED pixel with its electrodes) from the environment, a barrier layer between the polymeric substrate and the device, and an encapsulation layer covering the whole device are necessary. FIG. 1 shows a cross section of an OLED device, with an flexible substrate 1, a barrier layer 2, a transparent conductive oxide (TCO) layer 3, OLED layer(s) 4 (organic), cathode 5 and encapsulation layer 6

Both, the organic layers 4 and also the metallic cathode 5 need to be protected from oxygen and vapor diffusion, the market requires that the device to be light weight and flexible, the functional layers to be transparent for light of the desired wavelength, the device to be easily manufacturable and the functional layers to have excellent mechanical properties. Additionally, the encapsulation layer 6 needs to offer some mechanical and chemical stability, must seal off the device hermetically and must closely fill the complex top structure of the device during application of the film (step coverage).

RELATED ART

Encapsulation layers have been proposed previously as a combination of a sputtered inorgaEnic layer such as $AlO_x$, SiN, SiON plus a polymer plus another inorganic layer (I-P-I structure). Alternatively a stack, a sequence of I-P-I-P-I . . . layers have been proposed to further improve the properties of the encapsulation layer (system). In such an arrangement the inorganic layer prevents the water diffusion while the organic layer have the purpose to planarize the inorganic layer and to provide a new smooth surface to deposit for the next inorganic layer. Pinhole-, particle-, and step coverage are further important functions of the organic layer.

In "Thin film encapsulation of OLED Displays with a NONON Stack" (Lifka/va Esch/Rosink in: SID 04 Digest, p. 1384 ff) the authors describe a sequence of SiN—SiO—SiN layers (NON) or, widened about further layers of that kind as NONON layer. WO 03/050894 describes basically the same system with typical layer thicknesses of 200 nm SiN, 300 nm SiO and again 200 nm of SiN. Similar related Prior Art is described in U.S. Pat. Nos. 6,268,695, 6,638,645, 6,576,351, 6,573,652, 6,597,111 and SID 2003, Baltimore, Proceeding 21.1/A. Yoshida.

Since prior art uses a succession of multiple organic and inorganic layers for the intended barriers, these stacks are expensive and difficult to produce, because they require several different process steps.

In consequence, a coating system suitable for such applications must show several, independent, separable process chambers. Besides the disadvantage of being costly for mass production due to the low throughput, there is also the risk for contamination during the transferring process from (process-) chamber to chamber for the stack formation.

In stacks where organic and inorganic materials are layered alternatingly, problems also arise due to the mismatch in mechanical and chemical properties of organic and inorganic materials: different thermal expansion coefficients, insufficient adhesion on each other and many more.

In general, the chemical compatibility of such barrier stacks with the OLED process is a matter of concern.

When glass or metal lids are alternatively used as an environmental encapsulation, flexibility and lightweight is lost and when single inorganic layers (such as silicon nitride layers) are used, the requirements for permeability are not fulfilled.

DETAILED DESCRIPTION OF THE INVENTION

The present invention provides a diffusion barrier 2 and an encapsulation layer 6 by depositing a set of multiple inorganic layers (preferably of silicon nitride, SiNx) in a single step vacuum deposition process.

Figure 1:
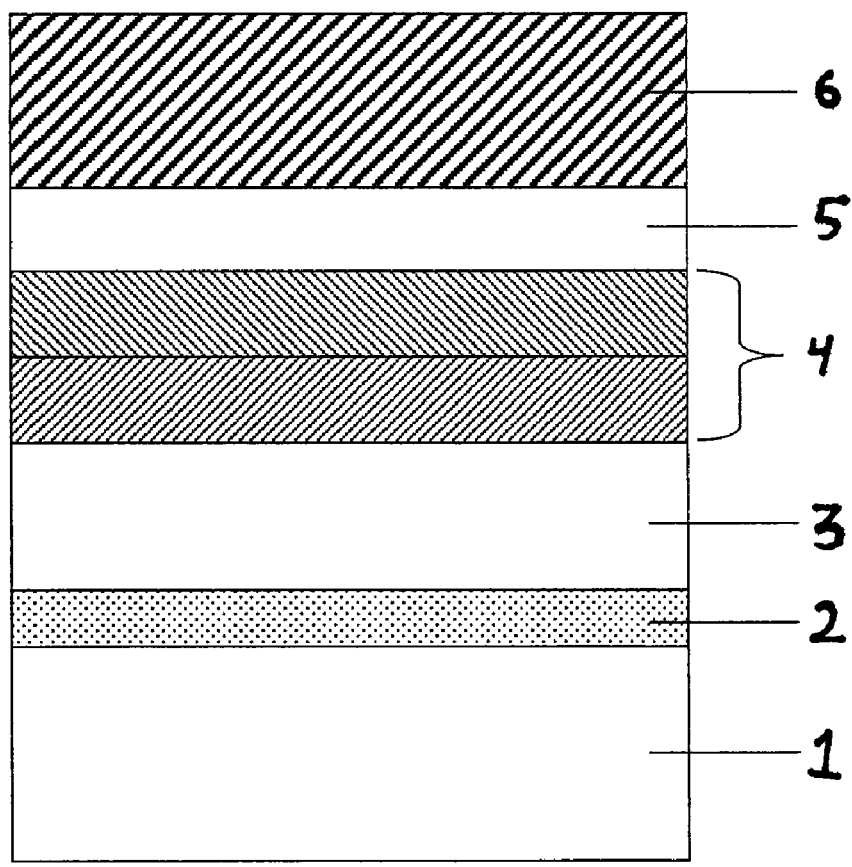
FIG. 1 shows the typical build up for an organic optoelectronic device on an organic substrate, comprising several layers (Order from bottom to top: flexible substrate, barrier layer, TCO (transparent conductive oxide) layer, OLED (organic layers), cathode, and on top: encapsulation layer)
Figure 2:
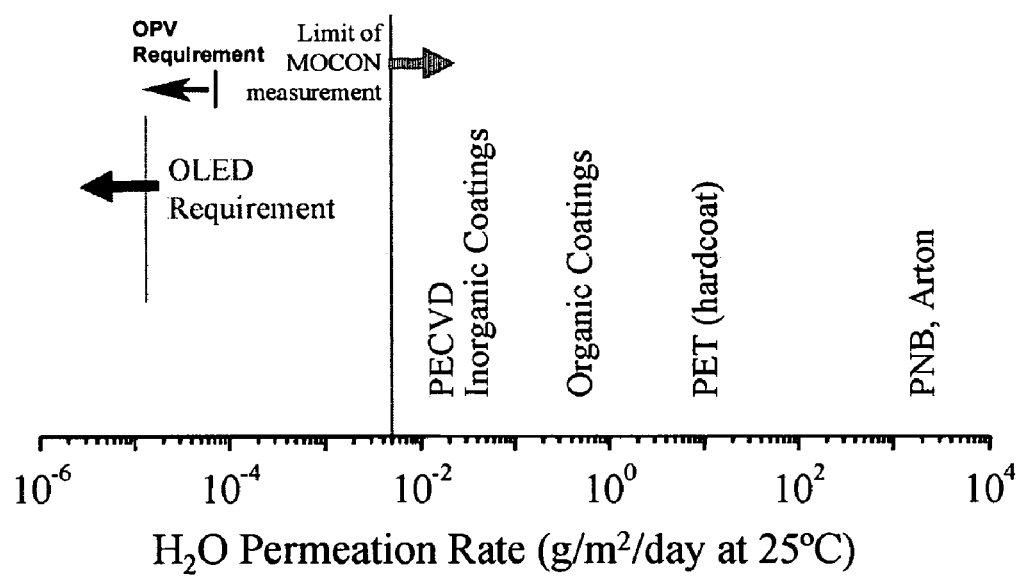
FIG. 2 shows the $H_2O$ permeation rate in grams per day and square meter at 25 degrees Celsius for certain specifications for OPV (organic photo voltaic) and OLED applications and on the same scale typical permeation rates for certain state-of-the-art coatings.
Figure 3:
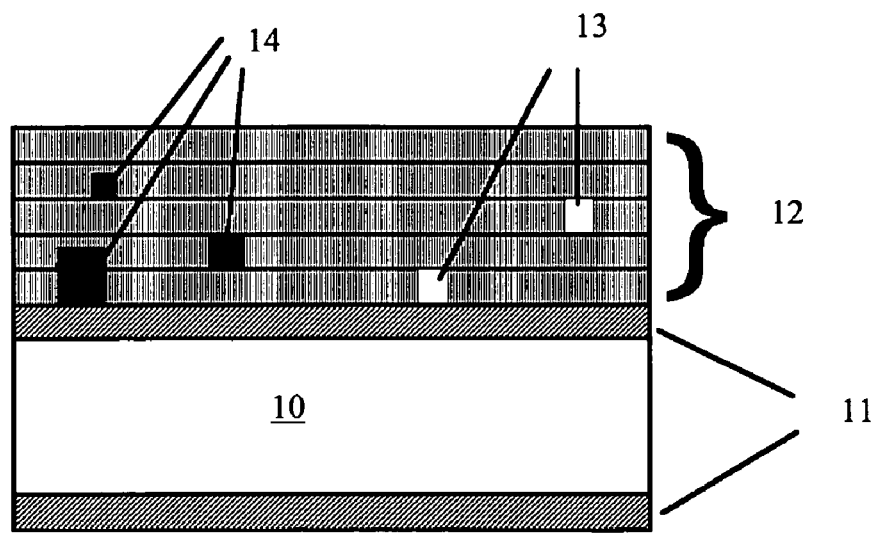
FIG. 3 shows a further embodiment of the invention.

FIG. 3 summarizes one embodiment of the present invention: A flexible substrate 10 shows barrier layer(s) 11. A stack of (multiple) inorganic layers 12 has been deposited, however shows, due to the manufacturing process, pinhole defects 13 and particles 14. Each layer of layer stack 12 shields against the environment independently and the average diffusion path lengths between defects are increased significantly.

The solution of the invention is based on multiple inorganic layers (preferably of silicon nitride). This plurality of layers is deposited by an essentially single step PECVD process (i.e. including only one loading/unloading operation into the process chamber), directly on polymeric substrates (which are known in the art) with hard coatings (which are also known in the art). By essentially and discretely controlling the atmospheric conditions (of $NH_3$, $H_2$, $SiH_4$, $N_2$) and other process parameters such as process pressure, process power, and substrate temperature during the single step PECVD deposition process, several discrete layers of inorganic material are deposited.

These layers may thus discreetly vary, not only in their stoechiometric composition, but also in the elements from which they are composed.

The layers according to the present invention provide faster packaging than prior art and must prevent damage to the device from moisture and oxygen, thereby improving the lifetime of the device. Such layers can also serve as "ultra high diffusion barrier" on polymeric substrates to protect the stack from the attack of moisture and gas through the substrate surface. In this case, the process parameters are adjusted for each application, e.g. encapsulation on the device side and diffusion barrier on the polymeric substrate side or sides. However, in both cases, conformal and defect-less layers at relatively low process temperature are required to avoid mechanical deformation of the substrate and damage to the temperature sensitive OLED device.

Due to the fact that multiple discrete layers are deposited and present horizontally, the effect of defects (such as particles 14 and pinhole defects 13) are minimal perpendicular to the plane of attack. Unwanted chemical agents such as oxygen and vapor statistically find much less direct access paths across the multilayer inorganic stacks than in a much thicker single layer barrier with the same number of defects. This is why the diffusion coefficient across such multilayer inorganic stacks is much lower than across a single layer with the same overall thickness.

DESCRIPTION OF THE PREFERRED EMBODIMENTS

In a first embodiment a diffusion barrier system for a display device comprises a layer system with at least two layers of dielectric material, wherein at least two adjacent layers of that layer system comprise the same material. In a further embodiment said dielectric material is one of an nitride, oxide, carbide and oxynitride or combinations thereof. Said dielectric material may comprise a metal or a semiconductor, and again the metal is one of Al, Cr, Cu, Ge, In, Ir Sb, Sn, Ta, Ti, Zr or combinations thereof. In a further preferred embodiment the dielectric material comprises silicon nitride or silicon oxynitride ($SiO_xN_y$). A display device with such diffusion barrier layer can be based on a substrate chosen from the group of glass, metal, polymer or paper.

Accordingly a method for manufacturing such a diffusion barrier system in a single process chamber of a plasma deposition system will have the steps of introducing a substrate to be treated in said process chamber, discretely varying in a controlled manner during deposition at least on of the process parameters in the process chamber gas flow, power, pressure, temperature without completely interrupting such process parameter, such that each variation results in a layer with different properties. Finally the substrate is removed from said process chamber.

EXAMPLE 1

Diffusion Barrier

In order to achieve a highly efficient diffusion barrier on both sides of a polymer substrate, the following process parameters have been chosen on a Unaxis KAI PECVD system for a stack of four layers of silicon nitride on each side of the substrate:

TABLE 1

| Temp. [° C.] T | Standard flow [sccm] SiH4 | Standard flow [sccm] NH3 | Standard flow [sccm] N2 | Standard flow [sccm] H2 | Pressure [mbar] p | RF Power [kW] P | Step time [min] t | Thickness [nm] D | Deposition rate [Å/s] D/t |
|---|---|---|---|---|---|---|---|---|---|
| 175 | 80 | 600 | 500 | 750 | 0.7 | 700 | 2.35 | 100 | 6.45 |
| 175 | 80 | 600 | 500 | 500 | 0.7 | 650 | 2.46 | 100 | 6.01 |
| 175 | 80 | 600 | 500 | 750 | 0.7 | 700 | 2.35 | 100 | 6.45 |
| 175 | 80 | 600 | 500 | 500 | 0.7 | 650 | 2.46 | 100 | 6.01 |

For comparison, a single layer of silicon nitride with the same overall thickness, has also been deposited on both sides of a substrate with the following parameters:

TABLE 2

| Temp. [° C.] T | Standard flow [sccm] SiH4 | Standard flow [sccm] NH3 | Standard flow [sccm] N2 | Standard flow [sccm] H2 | Pressure [mbar] p | RF Power [kW] P | Step time [min] t | Thickness [nm] D | Deposition rate [Å/s] D/t |
|---|---|---|---|---|---|---|---|---|---|
| 175 | 80 | 600 | 500 | 750 | 0.7 | 700 | 10.2 | 400 | 6.45 |

While a glass substrate (used as a reference in the so called "Ca test", see below) exhibited a water vapor transition rate (WVTR) of $3.1 \times 10^{-5}$, the multilayer silicon nitride stack according to Table 1 showed a WVTR of $1.5 \times 10^{-4}$, and the single layer stack according to Table 2 showed a WVTR of $6.84 \times 10^{-3}$ g/m²/day at 20° C. and at 50% humidity.

The "Ca test" is a permeation test, which is based on the corrosion of reactive metal films. This all-optical method is used to quantify the water transmission rate of substrates provided with high performance diffusion barriers and is known to those skilled in the art.

A glass plate with a Calcium coating is glued to the test substrate (such as polymeric substrates with or without diffusion barrier layer and possibly also a reference glass substrate). Calcium readily reacts with water and oxygen entering the test substrate and becomes progressively transparent. This leads to a change in the optical transmission of Ca coating, which can be monitored in time. The change in the transmission of the cells is then used to quantify effective permeation rates (WVTR). However, with this method, the change in the WVTR is also due to the penetration of water through the "glue" material. That is why a reference glass substrate; which normally has a WVTR of $\sim 1 \times 10^{-6}$ is also tested.

Here the test glass showed a WVTR of $\sim 3 \times 10^{-5}$ and relative to the reference, the WVTR of the polymeric substrate/barrier layer system is measured to $1.5 \times 10^{-4}$.

EXAMPLE 2

Encapsulation Layer

In order to achieve a highly efficient encapsulation layer, the parameters in Table 3 have been used. Note that the deposition temperatures have been substantially reduced as not to damage the organic structures to be encapsulated.

The multilayer silicon nitride stack deposited at 120° C. showed a WVTR of $5.66 \times 10^{-4}$. By adjusting the process parameters, one can further reduce the permeation rates to the same level or even lower than the values for 175° C. process without loss of functionality.

In a third example, the deposition temperature has further been lowered to 80° C. with promising results.

In a fourth example, silicon nitride ($SiN_x$) and silicon oxynitride ($SiO_xN_y$) layers are deposited alternatingly on top of each other.

The preferred number n of inorganic layers according to the invention is at least 2, with a preferred range of 2-10. Even more layers may be useful, and can be adjusted according to specific requirements. The thickness of each layer can vary between 15-100 nm (the upper limit can be adjusted according to specific requirements). The values for x in $SiN_x$ range between 0 and 4/3.

By carefully designing a single run step PECVD deposition process (single loading/unloading step and thus a single deposition run step), a simple, economic and very effective encapsulation layer and an environmental barrier has been found. Average water permeation values of $1.5 \times 10^{-4}$, and peak values as low as $9 \times 10^{-5}$ gr/m²/day were thus achieved.

The barrier layers were prepared with different polymeric substrate pre-treatment, such as cleaning in an ultrasonic bath in order to reduce the particle concentration prior to the deposition, since cracks and micro-cracks initiate at microscopic defect sites, thereby, reducing the permeation rate and the mechanical stability.

The layers according to the invention are transparent in the visible range, which is a requirement for most structures of optoelectronic devices.

Silicon nitride multilayer barriers are excellent, both from the mechanical and from the processing standpoint. They are able to resist cracking during OLED processing and possess

TABLE 3

| Temp. [° C.] T | Standard flow [sccm] SiH4 | Standard flow [sccm] NH3 | Standard flow [sccm] N2 | Standard flow [sccm] H2 | Pressure [mb] p | RF Power [kW] P | Step time [min] t | Thickness [nm] D | Deposition rate [Å/s] D/t |
|---|---|---|---|---|---|---|---|---|---|
| 120 | 80 | 600 | 500 | 750 | 0.7 | 700 | 2.35 | 100 | 6.45 |
| 120 | 80 | 600 | 500 | 500 | 0.7 | 650 | 2.46 | 100 | 6.01 |
| 120 | 80 | 600 | 500 | 750 | 0.7 | 700 | 2.35 | 100 | 6.45 |
| 120 | 80 | 600 | 500 | 500 | 0.7 | 650 | 2.46 | 100 | 6.01 | excellent foldability. The crack resistance of the layers is decisive, since mechanical failure of the diffusion barriers will directly result in a shortened lifetime of the device. The failure onset of the layers according to the invention is equal to approx. 1.5% strain, which enables a minimum achievable curvature radius of approximately 34 mm for a 100 μm thick substrate. Adhesion of the layers to both glass and to polymeric substrates is found to be very high. The analysis proves a very high tensile strength (2.5 GPa) and very high interfacial shear strength (230 MPa) for the layers on polymer, indicating that a strong interface is created during plasma deposition of the nitrides. The tensile failure of the $SiN_x$ is coupled to that of the underlying hard coat. Furthermore, the cohesion and adhesion of $SiN_x$ on polymeric substrate with and without hard coat layer before and after hydrothermal loading (1 h in water at RT) are found to be essentially unchanged.

Figure 4:
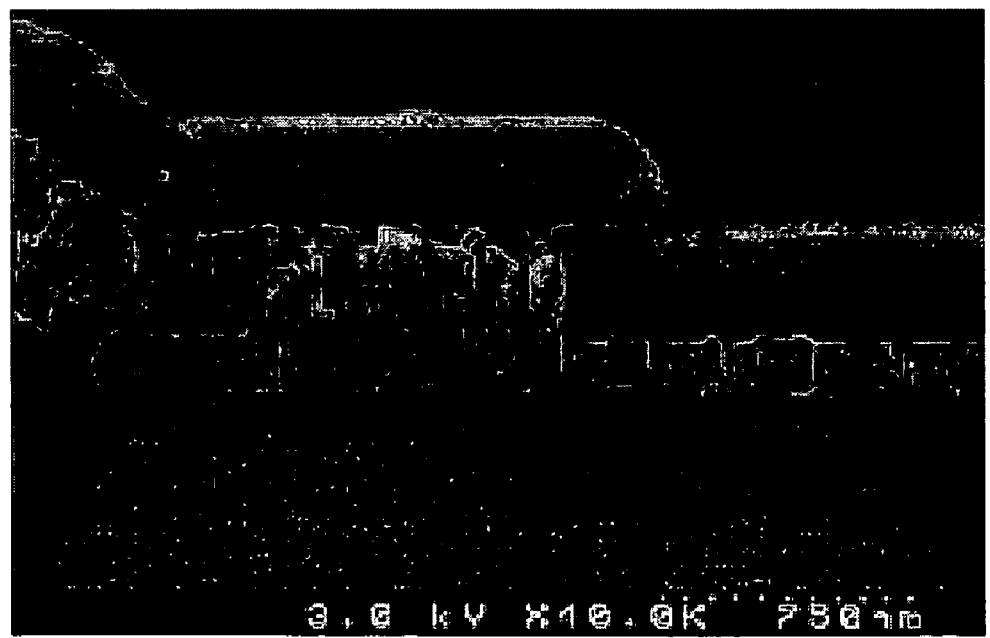
FIG. 4 shows a scanning electron micrograph (SEM) with the excellent step coverage of an inorganic layer according to the invention.

The multiple layers deposited by PECVD achieve excellent step coverage for the covering of all patterned structures of the OLED stack, and the layers retain high barrier properties. FIG. 4 illustrates in a scanning electron micrograph the excellent step coverage of an inorganic layer according to the invention. Using a PECVD single run multi layer process, complex structures are covered perfectly.

The production of multilayer inorganic barrier is reproducible, and provides high throughput and low risk for contamination due to the single step process. The multilayer provides no mechanical miss-match and is chemically and mechanically stable.

Since the inorganic layers according to the present invention are generally chemically very stable (unlike the inorganic/organic stacks in prior art), excellent etching resistance is achieved. The chemical compatibility of the prior art diffusion barriers with the OLED processing is a matter of concern. Alumina of prior art is not resistant against common etching solutions and the adhesion between the organic and inorganic layer fails easily for instance after processing steps (e.g. etching) and after mechanical and thermal cycling. Due to the inherent stack instability, mechanical failure of such stacks is inevitable.

In general, the properties of multilayer inorganic diffusion barrier produced utilizing vacuum deposition technologies are far superior to what can be achieved by multiple layers of organic/inorganic foils & stacks as described in prior art.

What is claimed is:

1. A diffusion barrier or encapsulation layer system comprising an inorganic layer system of dielectric material, with at least two adjacent layers of that inorganic layer system comprising the same material, said dielectric material being one of a nitride, oxide, carbide and oxynitride and combinations thereof of a metal or a semiconductor, wherein said inorganic layer system comprises at least four layers exhibiting a water vapor transition rate of or less than $5.66 \times 10^{-4}$ $g/m^2/day$ at 20° C. and 50% humidity.

2. Diffusion barrier or encapsulation layer system according to claim 1, wherein the metal is one of Al, Cr, Cu, Ge, In, Ir Sb, Sn, Ta, Ti, Zr or combinations thereof.

3. Diffusion barrier or encapsulation layer system according to claim 1, wherein the dielectric material comprises silicon nitride or silicon oxynitride ($SiO_xN_y$).

4. Diffusion barrier or encapsulation layer system according to claim 1 wherein each layer in said system has a layer thickness is in the range of 15-100 nm.

5. Display device comprising a substrate chosen from the group of glass, metal, polymer or paper with a diffusion barrier system according to claim 1.

6. Display device according to claim 5, further comprising a organic light emitting diode layer.

* * * * *

UNITED STATES PATENT AND TRADEMARK OFFICE
CERTIFICATE OF CORRECTION

PATENT NO. : 7,492,091 B2
APPLICATION NO. : 11/061143
DATED : February 17, 2009
INVENTOR(S) : Maryam Kharrazi-Olsson et al.

Page 1 of 1

It is certified that error appears in the above-identified patent and that said Letters Patent is hereby corrected as shown below:

Column 4, line 31, please replace the word "on" with -- one --.

Signed and Sealed this

Thirtieth Day of June, 2009

JOHN DOLL
*Acting Director of the United States Patent and Trademark Office*